United States Patent
Yang et al.

(10) Patent No.: US 9,379,089 B2
(45) Date of Patent: Jun. 28, 2016

(54) ELECTRICAL SYSTEM AND CORE MODULE THEREOF

(71) Applicant: Princo Middle East FZE, Dubai (AE)

(72) Inventors: Chih-kuang Yang, Hsinchu (TW);
Cheng-yi Chang, Hsinchu (TW);
Yeong-yan Guu, Hsinchu (TW);
Gan-how Shaue, Hsinchu (TW)

(73) Assignee: PRINCO MIDDLE EAST FZE, Dubai (AE)

( * ) Notice: Subject to any disclaimer, the term of this patent is extended or adjusted under 35 U.S.C. 154(b) by 0 days.

(21) Appl. No.: 14/162,130

(22) Filed: Jan. 23, 2014

(65) Prior Publication Data
US 2014/0312490 A1    Oct. 23, 2014

(30) Foreign Application Priority Data

Apr. 23, 2013 (TW) ............................. 102114460 A

(51) Int. Cl.
| | |
|---|---|
| *H01L 25/065* | (2006.01) |
| *H01L 23/00* | (2006.01) |
| *H01L 25/03* | (2006.01) |
| *H01L 25/00* | (2006.01) |
| H01L 25/18 | (2006.01) |

(52) U.S. Cl.
CPC ............ *H01L 25/0652* (2013.01); *H01L 24/17* (2013.01); *H01L 25/03* (2013.01); *H01L 25/50* (2013.01); *H01L 24/13* (2013.01); *H01L 24/16* (2013.01); *H01L 24/32* (2013.01); *H01L 24/73* (2013.01); *H01L 24/81* (2013.01); *H01L 25/18* (2013.01); *H01L 2224/13111* (2013.01); *H01L 2224/16225* (2013.01); *H01L 2224/32225* (2013.01); *H01L 2224/73204* (2013.01); *H01L 2224/81815* (2013.01); *H01L 2924/12042* (2013.01); *H01L 2924/14* (2013.01); *H01L 2924/1431* (2013.01); *H01L 2924/1432* (2013.01); *H01L 2924/1434* (2013.01); *H01L 2924/1438* (2013.01); *H01L 2924/1443* (2013.01); *H01L 2924/1461* (2013.01); *H01L 2924/15192* (2013.01); *H01L 2924/15311* (2013.01); *H01L 2924/15331* (2013.01); *H01L2924/181* (2013.01); *H01L 2924/19041* (2013.01); *H01L 2924/19043* (2013.01); *H01L 2924/19105* (2013.01); *H01L 2924/37001* (2013.01)

(58) Field of Classification Search
CPC ..... H01L 25/0652; H01L 25/03; H01L 25/50; H01L 24/16; H01L 24/13; H01L 24/73; H01L 24/81; H01L 25/18; H01L 24/32
See application file for complete search history.

(56) References Cited

U.S. PATENT DOCUMENTS

| | | | |
|---|---|---|---|
| 6,477,284 B1 * | 11/2002 | Oda et al. .......................... | 385/14 |
| 6,917,097 B2 * | 7/2005 | Chow et al. .................... | 257/666 |

(Continued)

FOREIGN PATENT DOCUMENTS

JP        2009-163409        7/2009

*Primary Examiner* — William Coleman
(74) *Attorney, Agent, or Firm* — Hauptman Ham, LLP

(57) ABSTRACT

Disclosed is a core module, comprising: a package substrate, having a plurality of pads; a first component, connected to the pads of the package substrate corresponding to the first component with a plurality of first joint parts; a second component, connected to the pads of the package substrate corresponding to the first component with a plurality of second joint parts; and a third component, connected to the pads of the package substrate corresponding to the third component with a plurality of third joint parts, wherein the first component is positioned above the second component relative to the lower package substrate, and the first component, the second component and the third component are all electrically connected via the package substrate, and a main molding material is molding the first component, the second component and the third component.

46 Claims, 3 Drawing Sheets

(56) References Cited

U.S. PATENT DOCUMENTS

| | | | |
|---|---|---|---|
| 8,612,582 B2* | 12/2013 | Dare et al. | 709/224 |
| 8,653,654 B2* | 2/2014 | Chandra et al. | 257/724 |
| 2008/0211078 A1 | 9/2008 | Kwon et al. | |
| 2009/0236723 A1 | 9/2009 | Bae et al. | |
| 2010/0153625 A1 | 6/2010 | Sugita et al. | |
| 2011/0090662 A1 | 4/2011 | Jang et al. | |
| 2012/0036442 A1 | 2/2012 | Dare et al. | |
| 2012/0319293 A1 | 12/2012 | Cheah et al. | |

\* cited by examiner

ELECTRICAL SYSTEM AND CORE MODULE THEREOF

CROSS-REFERENCE TO RELATED APPLICATION

This application claims priority from and the benefit under 35 U.S.C. §119(a) of Taiwanese Patent Application No. 102114460, filed on Apr. 23, 2013 in the TIPO (Taiwan Intellectual Property Office), which is hereby incorporated by reference for all purposes as if fully set forth herein.

BACKGROUND OF THE INVENTION

1. Field of the Invention

The present invention generally relates to an electrical system and a core module thereof, and more particularly to a multiple-component package-in-package electrical system and the core module thereof.

2. Description of Prior Art

On requirements of the high integration and microminiaturization for the electrical products, the present multiple device electrical system utilizes the stacked package skill. The stacked package nowadays has already developed many kinds of technologies. For example, the multiple-component stacked package (package on package) or SiP (system in package) is shown in FIG. 1. In such known skill, a first component A, a second component B and a third component C are integrated in one package module. The first component A is packaged with a first package substrate 100 in advance and molded with a first molding material 102. Then, the first component A is connected to a substrate D with solders. Moreover, for connecting the second component B positioned above, a plurality of vias 104 at the corresponding locations are formed and filled up with conductive metal material. The second component B is packaged with a second package substrate 200 in advance and molded with a second molding material 202. Then, the second component B is connected to the first component A with soldering tins. Moreover, for connecting the third component C positioned above, a plurality of vias 204 at the corresponding locations are formed and filled up with conductive metal material. The third component C is packaged with a third package substrate 300 in advance and molded with a third molding material 302. Then, the third component C is connected to the second component B with soldering tins. After all, a complete package module is finished. Besides, the stacked package shown in FIG. 1 employs the vias 104 and the vias 204 to realize the electrical connections among the components but the wiring skill is also utilized for realizing other necessary electrical connections.

However, such stacked package (Package on Package, PoP) skill remains several drawbacks. Each of the components does need mandatory pre-package individually. As the stacking-up proceeds, certain restriction of narrowing down the pitches of I/Os among the components exists. The devastating flaw of unable reducing the height of the module cannot be eliminated. Furthermore, the test after the whole stacked package becomes completed. The yield of the whole package relies on the previous test to the respective components before the stacked package and even some post-test cannot be performed for guaranteeing the reliability. Therefore, the risk of package failure must be taken. Besides, as aforementioned, the vias 104, the vias 204 and the wiring skill (not shown) are utilized to realize the electrical connections. All these increase the types of the electrical connections and complicate the manufacture processes. Consequently, the whole manufacture cost inevitably increases.

Accordingly, the objective of the present invention is to develop an electrical system and a core module thereof to eliminate the drawbacks of the package structure according to prior arts.

SUMMARY OF THE INVENTION

An objective of the present invention is to provide a core module, comprising a package substrate, having a plurality of pads; a first component, connected to the pads of the package substrate corresponding to the first component with a plurality of first joint parts; a second component, connected to the pads of the package substrate corresponding to the first component with a plurality of second joint parts; and a third component, connected to the pads of the package substrate corresponding to the third component with a plurality of third joint parts, wherein the first component is positioned above the second component relative to the lower package substrate, and the first component, the second component and the third component are all electrically connected via the package substrate, and a main molding material is molding the first component, the second component and the third component.

The core module of the present invention further comprises at least one fourth component, connected to the pads of the package substrate corresponding to the at least one fourth component with a plurality of fourth joint parts, and electrically connected with the first component, the second component and the third component via the package substrate, and the fourth component is also molded in the main molding material.

In the embodiments of the core module according to the present invention, the first component can be a memory device. The memory device comprises at least one non-volatile memory. The second component can be a logic device. The third component can be a power management device. The package substrate can be a thin film substrate with multi-layer interconnection.

Another objective of the present invention is to provide an electrical system, comprising: a package substrate, having a plurality of pads; a first component, connected to the pads of the package substrate corresponding to the first component with a plurality of first joint parts; a second component, connected to the pads of the package substrate corresponding to the first component with a plurality of second joint parts; a third component, connected to the pads of the package substrate corresponding to the third component with a plurality of third joint parts; and a circuit board, having a plurality of circuit board pads, connected to the package substrate with a plurality of circuit board solders, wherein the first component is positioned above the second component relative to the lower package substrate, and the first component, the second component and the third component are all electrically connected via the package substrate, and a main molding material is molding the first component, the second component and the third component.

The electrical system of the present invention further comprises at least one peripheral device, and the circuit board connects to the at least one peripheral device with the circuit board solders.

In the embodiments of the electrical system according to the present invention, the at least one peripheral device is selected from at least one of a GPS module, a WIFI module, a GSM module, a touch control module, an audio/video module, a display module, a MEMS magnetometer, a FM module, a USB host controller, a GPIO interface, a direct current power source, a switch device and a battery.

By utilizing the concept of package in package according to the present invention, the drawbacks of the prior arts, which pre-package are required for all the components in the multiple-component stacked package (package on package) skill, increasing manufacture cost and complicated processes can be solved. On demands, all the components does not need mandatory pre-package and therefore, the diverse structures of the component packages become possible to satisfy the function demands for the various product designs. Obviously, in the aforesaid multiple-component stacked package (package on package) skill, the test cannot be performed due to the complexity of the whole package once the whole package is completed but the present invention can. According to the core module of the present invention, all the components are electrically connected via one single package substrate. Therefore, the package processes can be further simplified for all the components. For example, all the components including the fourth component can be connected by SMT (Surface Mount Technology) and accordingly, the efficiency of the package process can be enormously promoted.

DETAILED DESCRIPTION OF THE INVENTION

Figure 1:
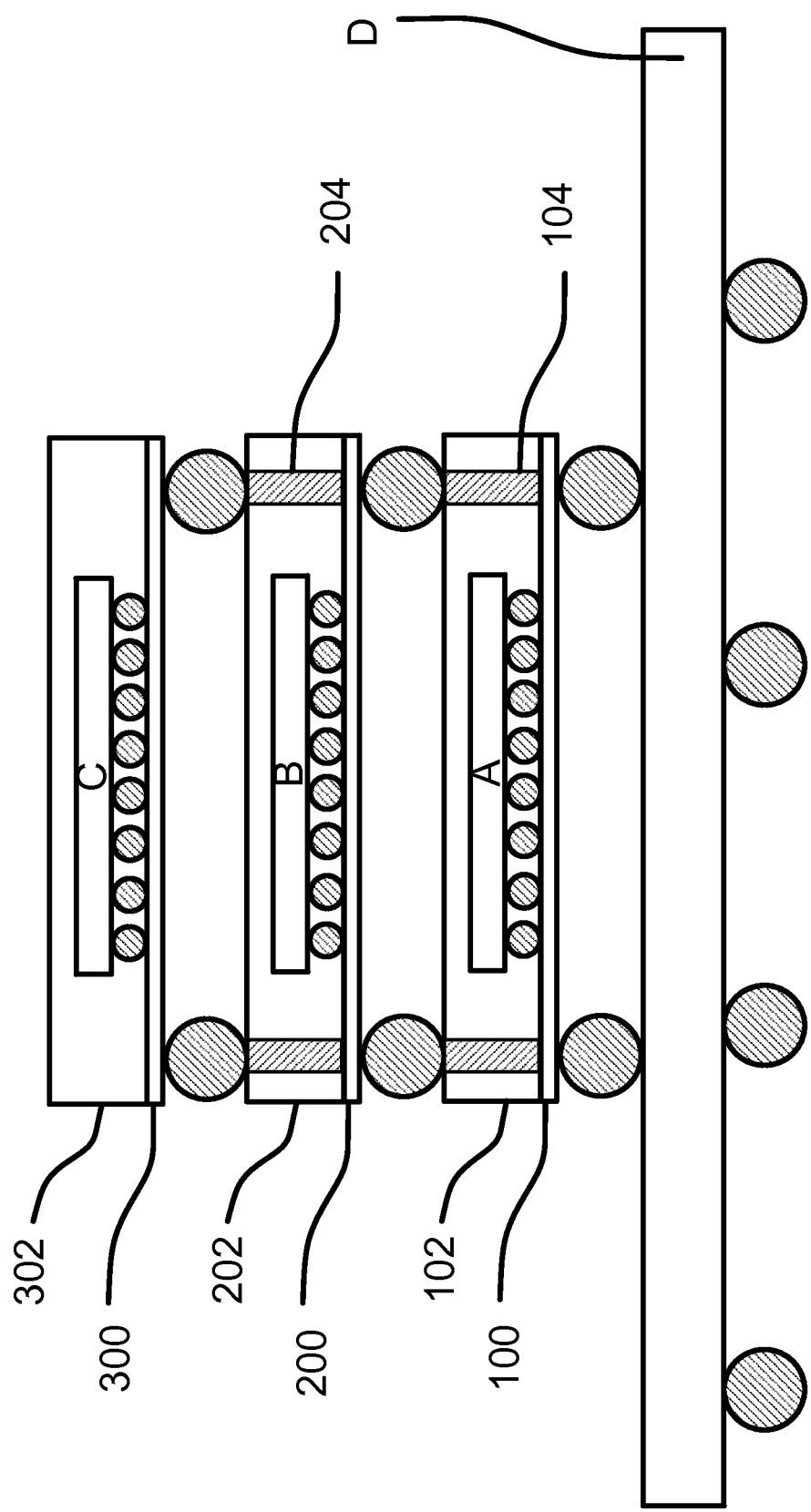
FIG. 1 depicts a diagram of a multiple-component stacked package (package on package) according to prior art.
Figure 2:
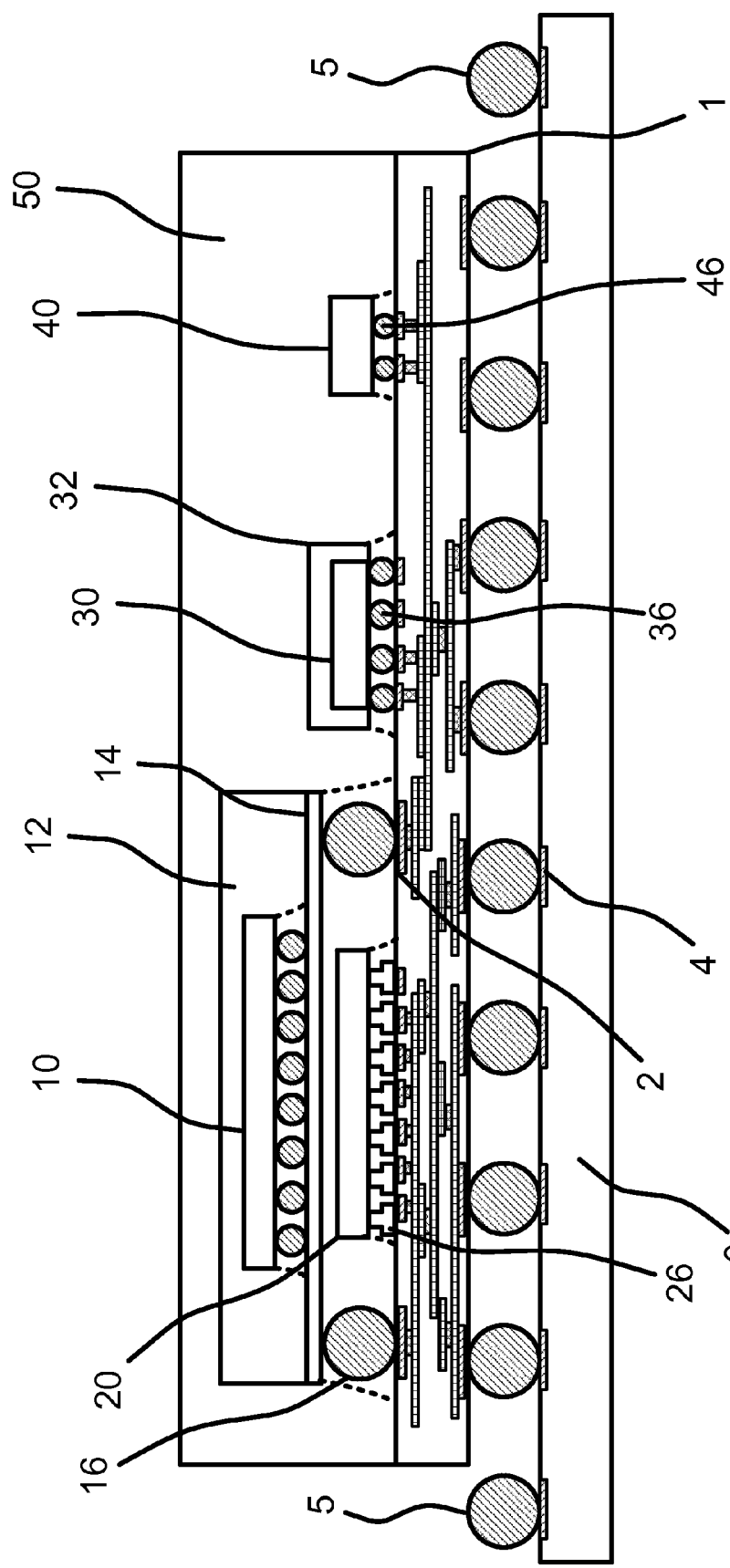
FIG. 2 depicts a sectional diagram of a core module and an electrical system according to the present invention.

Please refer to FIG. 2. FIG. 2 depicts a sectional diagram of a core module and an electrical system according to the present invention. The electrical system of the present invention comprises a package substrate 1, a first component 10, a second component 20 and a third component 30. The package substrate 1 has a plurality of pads and can be a thin film substrate. As shown in FIG. 2, the package substrate 1 can be a multi-layer interconnection substrate. An aggregate thickness of the multi-layer interconnection substrate employed as the package substrate 1 is less than 100 μm. Each single layer in the package substrate 1 is less than 20 μm, and even can be less than 10 μm. A smallest line width of the package substrate is less than 30 μm, and even can be less than 15 μm. Pitches of the pads are less than 80 μm, and even can be less than 50 μm. The definition of the pitch is a distance between the geometrical center points or the geometrical central lines of two pads. Significantly, the package substrate is to provide electrical connections among the first component 10, the second component 20 and the third component 30. In the present application, a first molding material 12 can be employed for previously molding the first component 10. The first component 10 can comprises the first package substrate 14 for firstly to be packaged thereon and then connected to the pads 2 of the package substrate 1 corresponding to the first component 10 with a plurality of first joint parts 16. As shown in the figure, the second component 20 and the first component 10 can be stacked up, i.e. the first component 10 can be above the second component 2 relative to the lower package substrate 1. The second component 20 is connected to the pads 2 of the package substrate 1 corresponding to the second component 20 with a plurality of second joint parts 26. In the embodiment of the present invention, the second component 20 can be a logic device, such as a processor. The first component 10 can be a memory device. The memory device can comprises at least one non-volatile memory, such as a NAND flash memory or a NOR flash memory.

In the present invention, a third molding material 32 can be employed for previously molding the third component 30. The third component 30 is connected to the pads 2 of the package substrate 1 corresponding to the third component 30 with a plurality of third joint parts 36. In the embodiment of the present invention, the third component 30 can be a power management device. Furthermore, the core module of the present invention can further comprises at least one fourth component 40, such as at least one passive component (capacitance or resistance) or any other type of component which is required in the circuit design of the electronic product utilizing the present invention. Similarly, the at least one fourth component 40 is connected to the pads 2 of the package substrate 1 corresponding to the at least one fourth component 40 with a plurality of fourth joint parts 46. Solders, bump or tin ball can be illustrated as the first joint parts 16, the second joint parts 26, the third joint parts 36 and the fourth joint parts 46. By the connection via the package substrate 1, the electrical connections among the first component 10, the second component 20 and the third component 30 can be realized. Accordingly, in the present invention, the first component 10, the second component 20, the third component 30 and the at least one fourth component 40 are all electrical connected. Besides, a main molding material 50 is employed and molding the first component 10, the second component 20, the third component 30 and the at least one fourth component 40 by a single reflow process to form a monolithic single package subject and to be employed as a core module of an electrical product (electrical system).

As shown in FIG. 2, by the connections of the solders and the pads with a high density substrate, i.e. the package substrate 1, the first component 10, the second component 20, the third component 30 and the at least one fourth component 40 are connected with one another. Then, all the components are molded inside the main molding material 50. Meanwhile, as shown in FIG. 2, for different application of designs, the space beneath the first component 10, i.e. the space between the first component 10 and the first package substrate 14, or the spaces beneath the first component 10 packaged by the first package substrate 14, the second component 20, the third component 30 and the at least one fourth component 40, i.e. the space between the first component 10 packaged by the first package substrate 14 and the package substrate 1, the space between the second component 20 and the package substrate 1, the space between the third component 30 and the package substrate 1, and the space between the at least one fourth component 40 and the package substrate 1 can be filled up with protective glue (indicated by the dot lines shown in FIG. 2). Alternatively, the protective glue of specific type can be used to fill up the space beneath the second component 20, first. Then, the protective glue of the same type or other type can be used to fill up the space beneath the first component 10 packaged by the first package substrate 14. The selection of the aforesaid protective glues specific for respective components can be different depending on the characteristic of the space, the water absorptions, thermal conductivities, thermal expansions and the glass transition temperatures of the protective glues. The protective glue of one type can be utilized. Protective glue of several kinds can be introduced. Even using main molding material 50 to fill up all the spaces in one time also can be an option in the present invention.

Moreover, the monolithic modularization of the core module and the electrical system according to the present invention provides skill advantages for the manufacture process. Because the first component 10, the second component 20, the third component 30 and the at least one fourth component 40 are connected to the pads corresponding thereto, with the first joint parts 16, the second joint parts 26, the third joint parts 36 and the fourth joint parts 46 respectively, merely one single reflow process is enough and required for the first joint parts 16, the second joint parts 26, the third joint parts 36 and the fourth joint parts 46 which all are positioned on the same plane and the corresponding pads of the package substrate 1. However, in the SiP (System in Package) skill, the SiP module is not monolithic, i.e. respective components are connected to the wafer, which as being a carrier, by respective reflow processes. Therefore, the connected components on the wafer may be de-soldered after the second reflow, or times of reflows.

Figure 3:
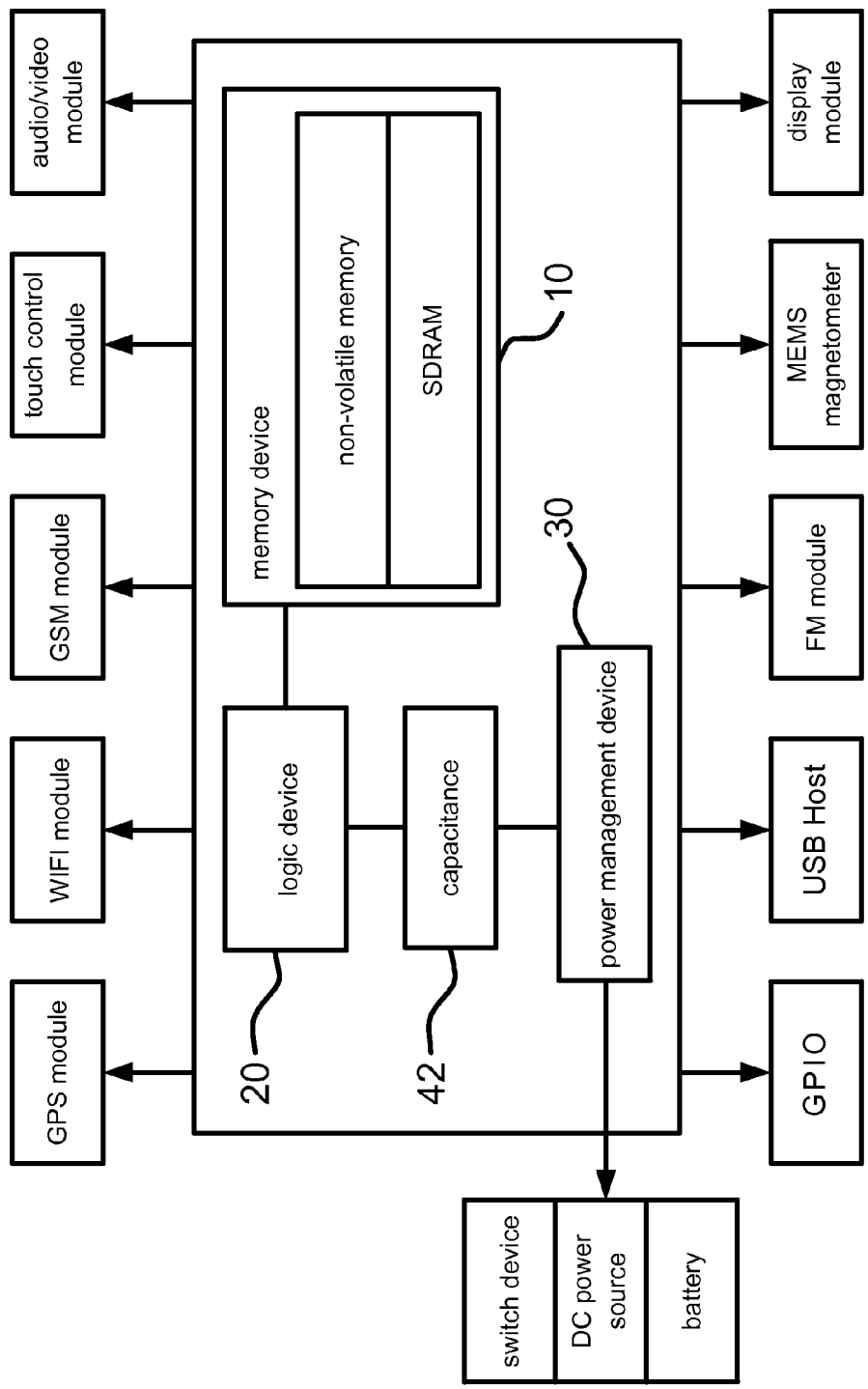
FIG. 3 depicts a function diagram of a core module and an electrical system according to the present invention.

Nowadays, the practicable method, such as: connecting solders (soldering tin) with higher temperature are employed at the first reflow, and connecting solders (soldering tin) with higher temperature are employed for the soldering points at the second reflow or the later reflows. However, such resolution remains lots of restrictions. First, the connecting solders and the reflow process with higher temperature generate larger thermal shock and result in lower reliability of the components and shorter usage lifetime. Second, the de-soldered phenomenon may occur to the connected components at the second reflow or the later reflows if the connecting solders with higher temperature are not employed at the first reflow or previous reflows. After many times of reflows, the warpage of the package substrate 1 and circuit board 3 can even appear and cause de-soldering between the connecting solders and the pads or missing soldering Please refer to FIG. 2 and FIG. 3. FIG. 3 depicts a function diagram of a core module and an electrical system according to the present invention. As shown in FIG. 2 and FIG. 3, the electrical system of the present invention comprises a package substrate 1, a first component 10, a second component 20, a third component 30, and a circuit board 3. The circuit board 3 has a plurality of circuit board pads 4 and connected to the package substrate 1 with a plurality of circuit board solders 5. The electrical system of the present invention further comprises at least one peripheral device. The circuit board 3 can be connected to the at least one peripheral device also with the circuit board solders 5.

The second component 20 of the present invention can be a logic device, such as a processor or a programmable IC. Because its active power is larger, the bare die package can be applied thereto in the embodiment of the present invention to reduce the thermal resistance. Meanwhile, as shown in FIG. 2, the second component 20 can be located closer to the package substrate 1. Micro bumps can be employed as the second joint parts 26 (the size of the micro bumps can be less than 50 µm, and preferably be 20~50 µm; the heights of the bumps can be less than 50 µm, and preferably be 10~20 µm). For example, stud bumps can be illustrated to effectively reduce the downward thermal resistance and efficiently transfer the heat to the package substrate 1. It is beneficial for the entire system performance of the electrical system and the core module thereof according to the present invention.

The first component 10 can be a memory device. The memory device comprises at least one non-volatile memory and a SDRAM/DRAM or the combinations thereof. It depends on different demands of the final system design of the electrical system and the core module thereof according to the present invention. As shown in FIG. 2, the first component 10 can located above the second component 20 to allow larger and flexible deployment space. Different combinations of memory module can be allocated depending on the demands of the system designs but without the interference to the package process and space allocation of the second component 20.

The third component 30 can be a power management device (power management IC). At least one capacitance 42 is connected between the second component 20 and the third component 30 for practically providing power to the processor or the programmable IC. The at least one fourth component 40 not only comprises the aforesaid capacitance or resistance but also a communication component, an AD convertor, an oscillator . . . or etc., which can be a package component, a bare die device not shown in figures or a wafer level CSP device. Accordingly, the higher integration and further microminiaturization of the electrical system and the core module thereof according to the present invention can be achieved.

Furthermore, as shown in FIG. 2 and FIG. 3, the power management device can be connected to a DC power source, a switch device, a battery or any other required components outside the electrical system via the circuit board 3 and the circuit board solder 5. The processor or the programmable IC can be connected to a GPS module, a WIFI module, a GSM module, a touch control module, an audio/video module, a display module, a MEMS magnetometer, a FM module, a USB host controller, a GPIO interface via the circuit board 3 and the circuit board solder 5. According to the present invention, the multi-layer interconnection substrate as utilized as the package substrate 1 has already achieved most required electrical connections for the design of the core module, and the skill feature of the core module which is a monolithic single package subject formed by package in package according to the present invention. Merely a low density integration circuit board 3 is enough and required and the various kinds of function required for the electrical system of the present invention can be realized.

As said in previous description, in the electrical system and the core module thereof according to the present invention, the first component 10, the second component 20, the third component 30 and the at least one fourth component 40 are all electrical connected with one another via the package substrate 1. Therefore, the Surface Mount Technology package can be applied for the first component 10, the second component 20, the third component 30 and the at least one fourth component 40 and then, only one single reflow is required to achieve the whole package. Certainly, the one single reflow is not a restriction to the present invention for achieving the whole package. Meanwhile, respective pre-moldings are not essential for the first component 10, the second component 20 and the third component 30 but depending on whether the demands of the pre-molding is required or not. Before the reflow, or molding all the components with the main molding material 50, more tests can be possible and practical to the components according to the present invention. Once the electrical defaults exist, the correction can be performed before the molding with the main molding material 50. The efficiency of the package process is magnificently promoted and raised. The ultimate yield also can be raised because the defects in the package can be prevented and invalidation of devices due to the unable rework can be avoided. Accordingly, the manufacture cost can be effectively reduced.

Furthermore, as said in previous description, the main molding material 50 is employed to form a monolithic single package subject as a core module in the present invention and the high integration characteristic is provided. The multilayer interconnection substrate as utilized as the package substrate 1 has already achieved most required electrical connections for the design of the core module, and the skill feature of the package in package (PIP) according to the present invention. Only the low density integration print circuit board (PCB) for manufacturing the electrical system rather than the high density interconnection print circuit board (HDI PCB) is necessary in prior arts. The general structure of the high density integration print circuit board at least comprises 6-8 layers and meanwhile, the laser drill is essential for forming the via structures therein. By employing the present invention, the layer amount of the low density print circuit board (PCB) can be less than four and the mechanical drill method will be quite enough to form the via structures therein and to realize the connection with the at least one peripheral device. In comparison with prior arts requiring the high density interconnection print circuit board (HDI PCB), a monolithic single package subject is formed as a core module with the concept of the package in package according to the present invention. The low density print circuit board (PCB) not only decreases manufacture cost but also makes manufacture more efficient. The reliability can be further raised effectively.

In conclusion, the concept of the package in package according to the present invention can solve the drawbacks of the prior arts, which the pre-packages are needed for all the components in the multiple-component stacked package (package on package) skill, the increasing manufacture cost and the complicated processes can be solved. The diverse structures of the component packages become possible to satisfy the function demands for the various product designs. The complexity of the test after the whole package is completed in the aforesaid multiple-component stacked package (package on package) skill can be prevented. On demands, all the components do not need mandatory individual pre-packages. Therefore, the electrical system and the core module according to the present invention provide the package in package characteristic. Ultimately, a complete package with the main molding material is performed. Moreover, all the components are electrically connected via one single package substrate. All the components including the fourth component can be connected by Surface Mount Technology and accordingly, one single reflow is enough and required to achieve the electrical connections. Before the reflow, the test and the correction are possible to be performed and the efficiency of the package process can be enormously promoted.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A core module, comprising:
a package substrate, having a plurality of pads;
a first component, packaged on a first package substrate and connected to the pads of the package substrate corresponding to the first component with a plurality of first joint parts, wherein the first joint parts connected to the package substrate are positioned on a bottom surface of the first package substrate;
a second component, connected to the pads of the package substrate corresponding to the second component with a plurality of second joint parts, wherein the second joint parts connected to the package substrate are positioned on a bottom surface of the second component; and
a third component, connected to the pads of the package substrate corresponding to the third component with a plurality of third joint parts, wherein the third joint parts connected to the package substrate are positioned on a bottom surface of the third component,
wherein the first component is positioned above the second component relative to the package substrate, and
the first component, the second component and the third component are all electrically connected via the package substrate, and
a main molding material is molding the first component, the second component and the third component, and
a space between the first component packaged by the first package substrate and the package substrate is filled up with protective glue, and
a bottom of each of the first joint parts, a bottom of each of the second joint parts, and a bottom of each of the third joint parts are positioned on the same plane.

2. The core module according to claim 1, wherein the first component is molded in a first molding material.

3. The core module according to claim 1, wherein the first joint parts, the second joint parts or the third joint parts are in a mode selected from solder, bump or tin ball.

4. The core module according to claim 1, further comprising at least one fourth component, connected to the pads of the package substrate corresponding to the at least one fourth component with a plurality of fourth joint parts, and electrically connected with the first component, the second component and the third component via the package substrate, and the fourth component is also molded in the main molding material.

5. The core module according to claim 1, wherein the second component is a logic device.

6. The core module according to claim 1, wherein the first component is a memory device.

7. The core module according to claim 1, wherein the third component is a power management device.

8. The core module according to claim 1, wherein the package substrate is a thin film substrate.

9. The core module according to claim 1, wherein an aggregate thickness of the package substrate is less than 100 μm.

10. The core module according to claim 1, wherein each single layer in the package substrate is less than 20 μm.

11. The core module according to claim 1, wherein a smallest line width of the package substrate is less than 30 μm.

12. The core module according to claim 1, wherein pitches of the pads are less than 80 μm.

13. The core module according to claim 1, wherein the first component, the second component and the third component are connected to the pads of the package substrate corresponding to the first component, the second component and the third component by a single reflow process.

14. The core module according to claim 1, wherein the second component is a bare die device.

15. The core module according to claim 4, wherein the fourth joint parts are in a mode selected from soldering tin, bump or tin ball.

16. The core module according to claim 5, wherein the logic device is a processor.

17. The core module according to claim 6, wherein the memory device comprises at least one non-volatile memory.

18. The core module according to claim 6, wherein the memory device comprises a NAND flash memory.

19. The core module according to claim 6, wherein the memory device comprises a NOR flash memory.

20. The core module according to claim 8, wherein the thin film substrate is a multi-layer interconnection substrate.

21. The core module according to claim 14, wherein the second joint parts are a plurality of micro bumps.

22. An electrical system, comprising:
a package substrate, having a plurality of pads;
a first component, connected to the pads of the package substrate corresponding to the first component with a plurality of first joint parts, wherein the first joint parts connected to the package substrate are positioned on a bottom surface of the first package substrate;
a second component, connected to the pads of the package substrate corresponding to the second component with a plurality of second joint parts, wherein the second joint parts connected to the package substrate are positioned on a bottom surface of the second component;
a third component, connected to the pads of the package substrate corresponding to the third component with a plurality of third joint parts, wherein the third joint parts connected to the package substrate are positioned on a bottom surface of the third component; and
a circuit board, having a plurality of circuit board pads, connected to the package substrate with a plurality of circuit board solder,
wherein the first component is positioned above the second component relative to the package substrate, and
the first component, the second component and the third component are all electrically connected via the package substrate, and
a main molding material is molding the first component, the second component and the third component, and
a space between the first component packaged by the first package substrate and the package substrate is filled up with protective glue, and
a bottom of each of the first joint parts, a bottom of each of the second joint parts, and a bottom of each of the third joint parts are positioned on the same plane.

23. The electrical system according to claim 22, wherein the first component is molded in a first molding material.

24. The electrical system according to claim 22, wherein the first joint parts, the second joint parts or the third joint parts are in a mode selected from soldering tin, bump or tin ball.

25. The electrical system according to claim 22, further comprising at least one fourth component, connected to the pads of the package substrate corresponding to the at least one fourth component with a plurality of fourth joint parts, and electrically connected with the first component, the second component and the third component via the package substrate, and the fourth component is also molded in the main molding material.

26. The electrical system according to claim 22, wherein the second component is a logic device.

27. The electrical system according to claim 22, wherein the first component is a memory device.

28. The electrical system according to claim 22, wherein the third component is a power management device.

29. The electrical system according to claim 22, wherein the package substrate is a thin film substrate.

30. The electrical system according to claim 22, an aggregate thickness of the package substrate is less than 100 µm.

31. The electrical system according to claim 22, wherein each single layer in the package substrate is less than 20 µm.

32. The electrical system according to claim 22, wherein a smallest line width of the package substrate is less than 30 µm.

33. The electrical system according to claim 22, wherein pitches of the pads are less than 80 µm.

34. The electrical system according to claim 22, wherein the first component, the second component and the third component are connected to the pads of the package substrate corresponding to the first component, the second component and the third component by a single reflow process.

35. The electrical system according to claim 22, wherein the second component is a bare die device.

36. The electrical system according to claim 22, further comprising at least one peripheral device, and the circuit board connects to the at least one peripheral device with the circuit board solder.

37. The electrical system according to claim 22, wherein the number of layers of the circuit board is less than 4.

38. The electrical system according to claim 22, wherein vias of the circuit board are formed by mechanical drill method.

39. The electrical system according to claim 25, wherein the fourth joint parts are in a mode selected from soldering tin, bump or tin ball.

40. The electrical system according to claim 26, wherein the logic device is a processor.

41. The electrical system according to claim 27, wherein the memory device comprises at least one non-volatile memory.

42. The electrical system according to claim 27, wherein the memory device comprises a NAND flash memory.

43. The electrical system according to claim 27, wherein the memory device comprises a NOR flash memory.

44. The electrical system according to claim 29, wherein the thin film substrate is a multi-layer interconnection substrate.

45. The electrical system according to claim 35, wherein the second joint parts are a plurality of micro bumps.

46. The electrical system according to claim 36, wherein the at least one peripheral device is selected from at least one of a GPS module, a WWI module, a GSM module, a touch control module, an audio/video module, a display module, a MEMS magnetometer, a FM module, a USB host controller, a GPIO interface, a direct current power source, a switch device and a battery.

* * * * *